US006803660B1

(12) United States Patent
Gates et al.

(10) Patent No.: US 6,803,660 B1
(45) Date of Patent: Oct. 12, 2004

(54) PATTERNING LAYERS COMPRISED OF SPIN-ON CERAMIC FILMS

(75) Inventors: Stephen M. Gates, Ossining, NY (US); Jeffrey C. Hedrick, Montvale, NJ (US); Elbert E. Huang, Tarrytown, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/627,790

(22) Filed: Jul. 25, 2003

Related U.S. Application Data

(60) Provisional application No. 60/443,361, filed on Jan. 29, 2003.

(51) Int. Cl.[7] .................................................. H01L 23/48

(52) U.S. Cl. .................. 257/758; 430/270.17; 428/447; 438/781

(58) Field of Search .................... 430/270.17; 428/447; 438/781

(56) References Cited

U.S. PATENT DOCUMENTS 5,009,986 A * 4/1991 Kawaguchi et al. ... 430/270.17
6,489,030 B1 12/2002 Wu et al.

* cited by examiner

*Primary Examiner*—David Nelms
*Assistant Examiner*—Mai-Huong Tran
(74) *Attorney, Agent, or Firm*—Scully, Scott, Murphy & Presser; Daniel P. Morris, Esq.

(57) ABSTRACT

The present invention comprises a method for forming a hardmask including the steps of depositing a polymeric preceramic precursor film atop a substrate; converting the polymeric preceramic precursor film into at least one ceramic layer, where the ceramic layer has a composition of $Si_vN_wC_xO_yH_z$ where $0.1 \leqq v \leqq 0.9$, $0 \leqq w \leqq 0.5$, $0.05 \leqq x \leqq 0.9$, $0 \leqq y \leqq 0.5$, $0.05 \leqq z \leqq 0.8$ for $v+w+x+y+z=1$; forming a patterned photoresist atop the ceramic layer; patterning the ceramic layer to expose regions of the underlying substrate, where a remaining region of the underlying substrate is protected by the patterned ceramic layer; and etching the exposed region of the underlying substrate. Another aspect of the present invention is a buried etch stop layer having a composition of $Si_vN_wC_xO_yH_z$ where $0.05<v<0.8$, $0<w<0.9$, $0.05<x<0.8$, $0<y<0.8$, $0.05<z<0.8$ for $v+w+x+y+z=1$.

9 Claims, 5 Drawing Sheets

Cross Sectional View of Single Hardmask Structure 61
51
41
31
32
36
33
37
34
1200
1100
1000
40

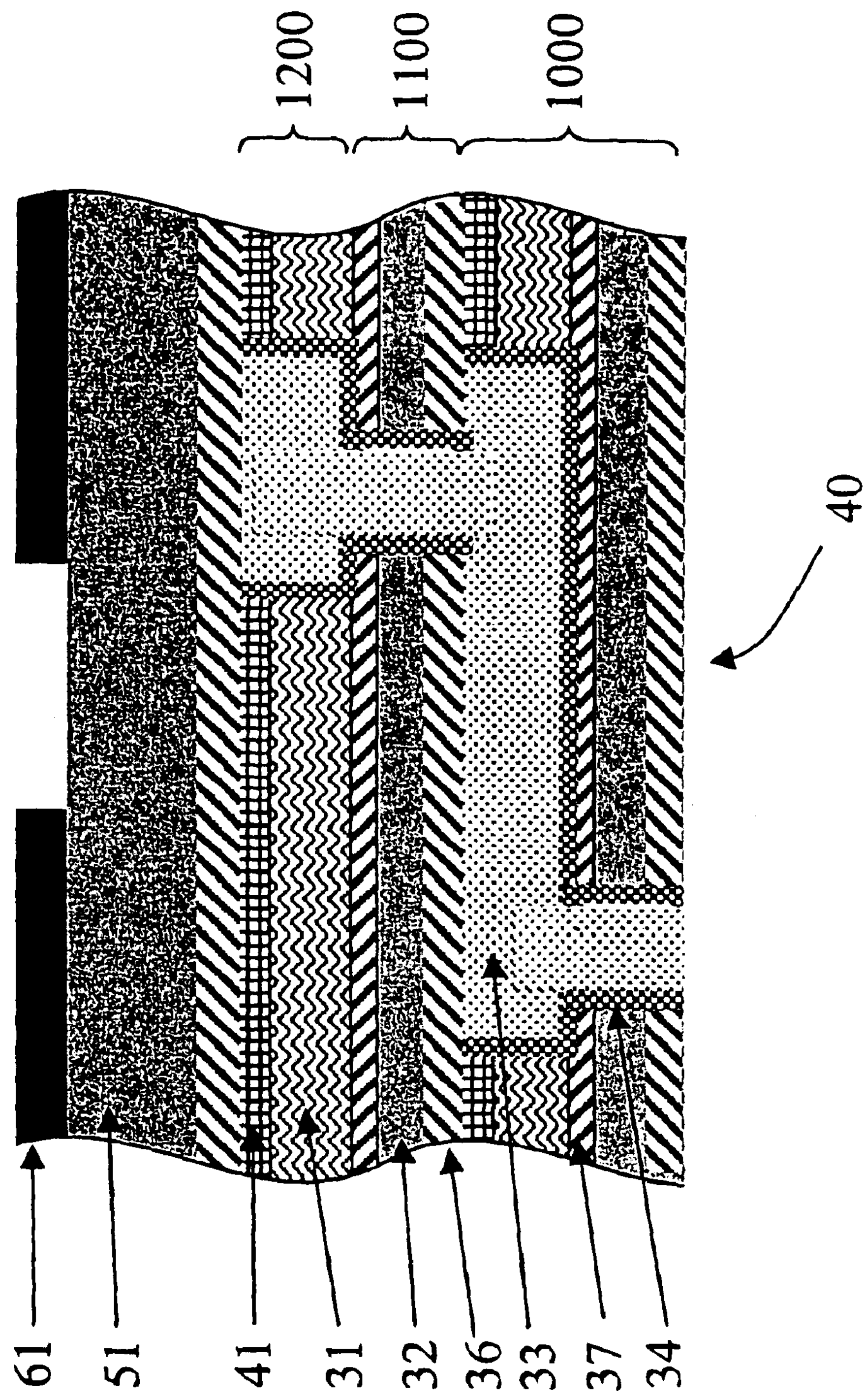
Figure 1: Cross Sectional View of Single Hardmask Structure

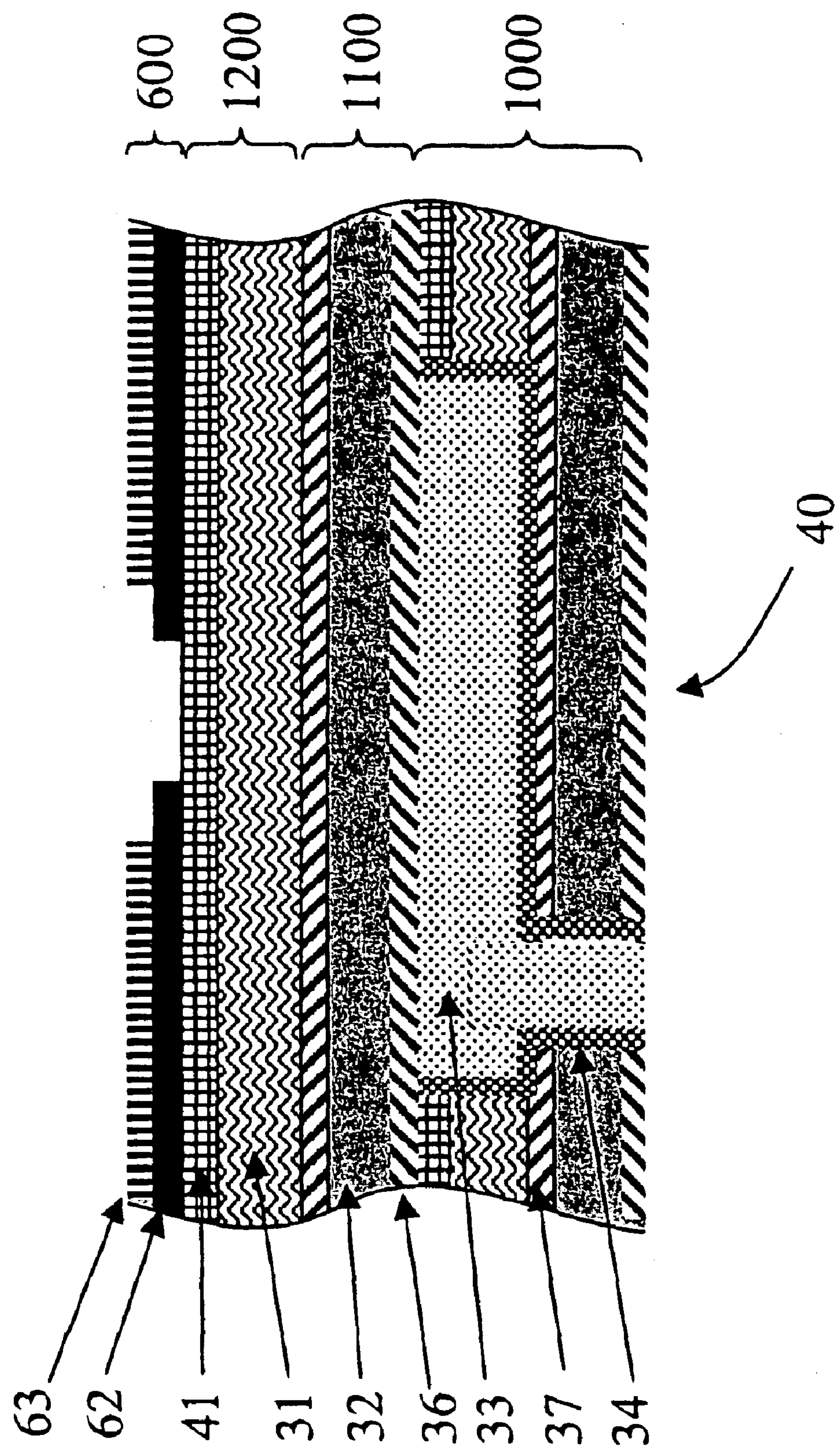
Figure 2: Cross Sectional View of Clustered Hardmask

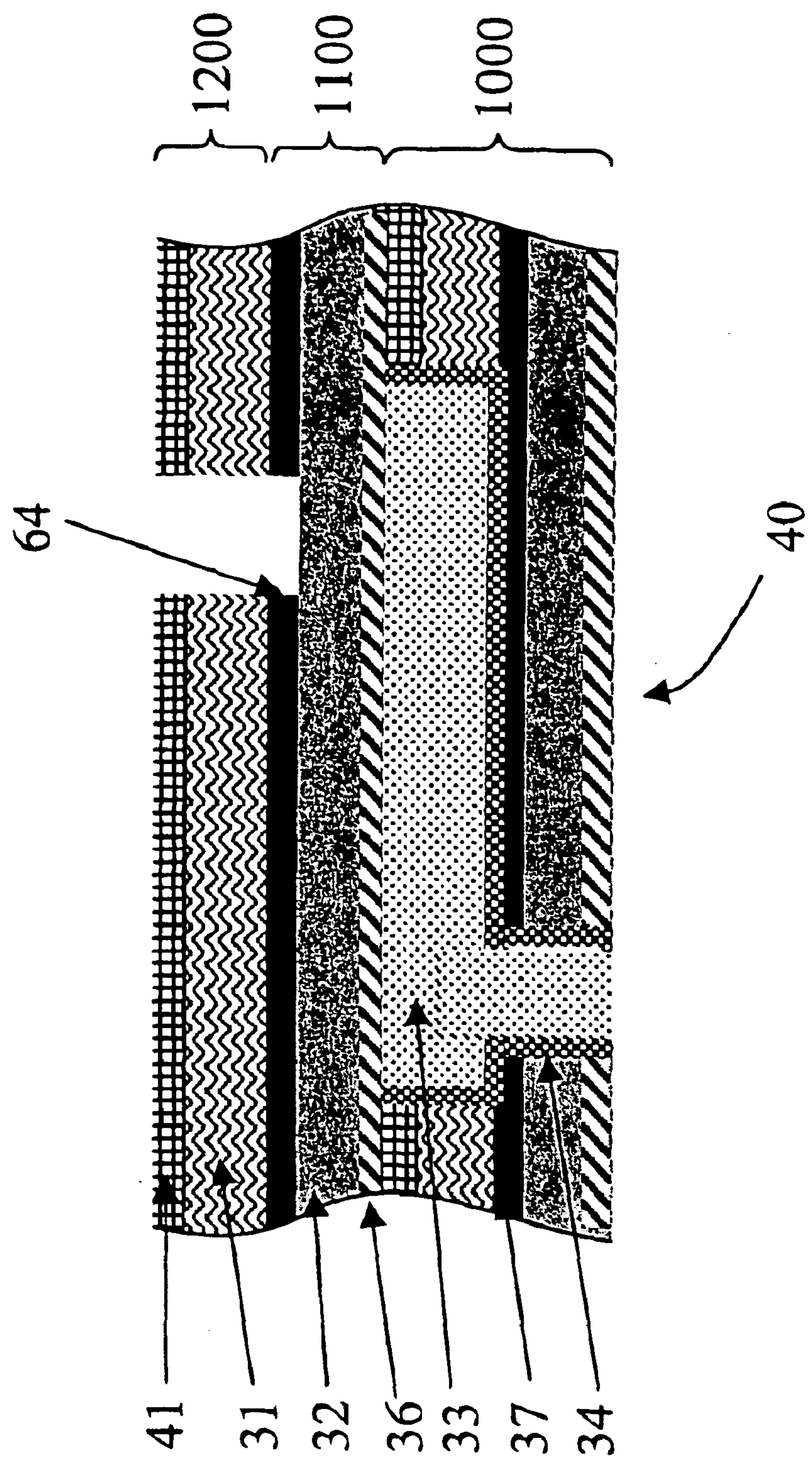
Figure 3: Cross Sectional View of Structure Having a Buried Etch Stop

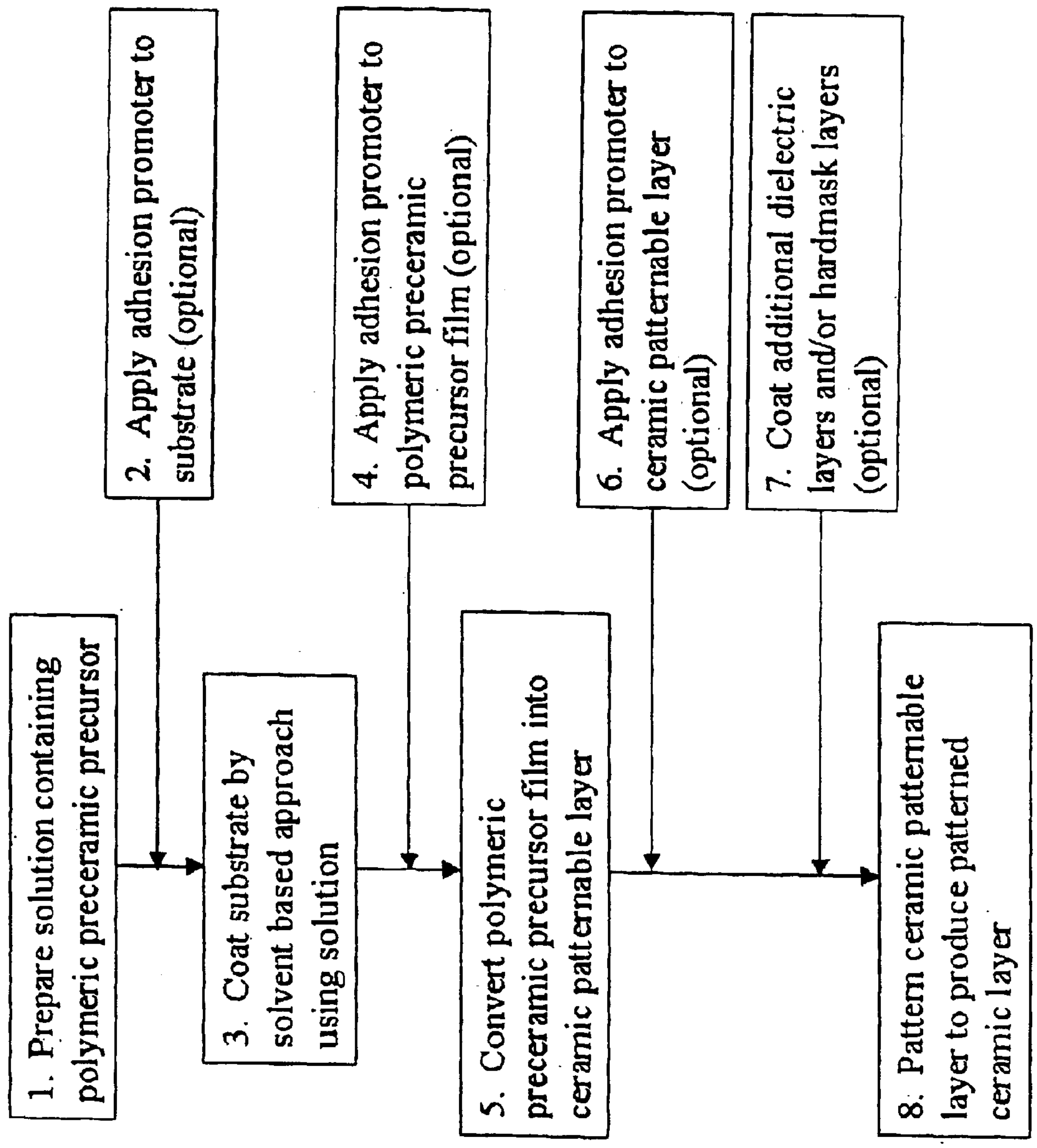
Figure 4: General Process Flow for Generation of Patterned Ceramic Layer Figure 5: Auger Depth Profiles showing Plasma Resistance Ceramic Patternable Layer Generated from Polysilazane Polymer Preceramic Precursor
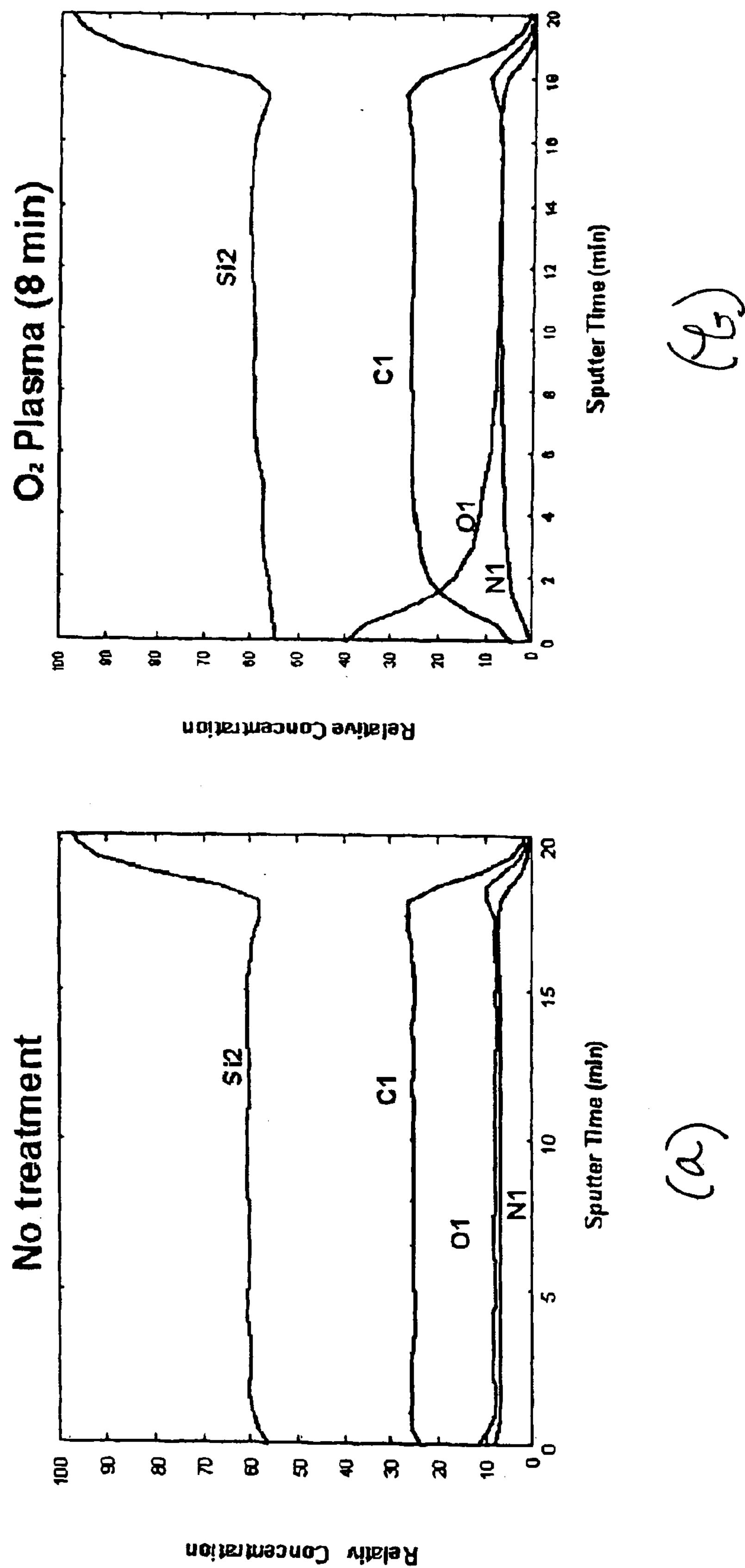

PATTERNING LAYERS COMPRISED OF SPIN-ON CERAMIC FILMS

CROSS REFERENCE TO RELATED APPLICATION

The present invention claims the benefit of U.S. provisional patent application No. 60/443,361 filed Jan. 29, 2003 the whole contents and disclosure of which is incorporated by reference as is fully set forth herein.

BACKGROUND OF THE INVENTION

1. Field of the Invention

The present invention relates to the utilization of ceramic layers as patterning layers. More particularly, it relates to the use of ceramic layers to produce metal interconnect structures that are part of integrated circuits and microelectronic devices. Two primary advantages are provided by this invention. First, the processing of the ceramic layers is facile as films can be applied by any solvent based process, e.g., spin coating. Second, the unique chemical compositions of the ceramic layers provides substantial chemical contrast between typical layers that are applied by solution based processes.

2. Background Art

The utilization of hardmask patterning layers and buried etch stops is commonly used for the fabrication of metal interconnect structures, that are part of integrated circuits and microelectronic devices. A number of attributes are often required for the successful utilization of these layers. First, they should be definable by dry etching processes (e.g., reactive ion etch) with the use of lithographic masks and have compositions that provide chemical contrast to other layers so that structures can be easily generated. Second, they may be required to be resistant to photoresist rework steps, such as oxidizing plasmas, reducing plasmas, acidic wet baths, etc., that may be needed in cases where misalignment of patterning layers occur. Third, they must exhibit thermal stability so that they can withstand other processes that require elevated temperature processing. Fourth, they need sufficient adhesion to adjacent layers in order to withstand planarizing steps and other processes that produce stress on the interconnect structure. Depending on their placement and use, they may be required to either be removable with reasonable chemical mechanical polishing (CMP) rates or serve as a stop layer for chemical mechanical polishing. If these layers, are contained in the final interconnect structure, the dielectric constants must be low in order to minimize resistance-capacitance (RC) delays and enhance performance. Finally, they should be processable in a quick and cost effective manner.

Typically, hardmask patterning layers and buried etch-stops are dielectrics systems that are deposited by chemical vapor deposition (CVD) and related methods. Although these processes allow the deposition of films having a variety of compositions including silicon oxides, silicon carbides, silicon nitrides, silicon carbonitrides, etc., they often involve costly manufacturing tools and can be process intensive and time consuming. In some cases, application of spin-on dielectrics have been proposed. However, these cases have been primarily limited to silsequioxanes, siloxanes, and other related chemistries that are primarily based on silicon-oxygen bonds.

SUMMARY OF THE INVENTION

This invention relates to ceramic structures and processing methods that are utilized in the manufacture of interconnect structures employed in any microelectronic device including: high speed microprocessors, application specific integrated circuits (ASICs), and memory storage. The utilization of ceramic patterning layers, which provide ease in processing, thermal stability, reworkability, and chemical contrast between other patterning layers, are advantageous as they reduce manufacturing costs and allow the generation of interconnect structures in a reliable manner.

In the first embodiment of this invention, structures having patterned ceramic layers on a substrate are described. The substrate in the first embodiment includes at least one layer that is intended for patterning. This layer is comprised of either metal or dielectric and may be either a uniform film or a patterned film. Underlying this layer, the substrate comprises of at least one conducting metal feature, formed on the substrate, with the substrate further comprising at least one insulating layer surrounding the conducting metal feature. The insulating layer may surround the at least one conducting metal feature at its bottom, top, and lateral surfaces. The substrate may further comprise at least one conductive barrier layer formed on at least one interface between the insulating layer and the at least one conducting metal feature. The combination of the at least one conducting metal feature and the insulating layers, may be repeated to form a multilevel interconnect stack.

The structure may be one of a silicon wafer containing microelectronic devices, a ceramic chip carrier, an organic chip carrier, a glass substrate, gallium arsenide, silicon carbide, gallium, or other semiconductor wafer.

In the first example of the first embodiment of this invention, structures having a single patterned ceramic layer are described. The single patterned ceramic layer may act as a single hard mask. In the second example of the first embodiment of this invention, structures having a clustered patterned ceramic layer are described. The clustered hard mask may comprise of at least two silicon containing dielectrics having two distinct patterns. In each of these embodiments, the ceramic layer(s) are placed on a substrate where they can be utilized to define at least one feature in the underlying structures by an etch processes step.

In the third example of the first embodiment of this invention, structures having a patterned buried etch stop are described. The buried etch stop contributes to defining the line and via levels of an interconnect structure and facilitates the generation of interconnect structures. This structure is comprised of a patterned film stack comprised of at least one dielectric layer on top of a buried etch stop, where the pattern is identical to each of these layers, and where the patterned film stack is placed on top of a substrate.

In the second embodiment of this invention, a method to generate hardmask patterning layers and buried etch stops is described. A polymeric preceramic precursor is dissolved in a suitable solvent and coated onto a substrate, having at least one film layer that is intended for patterning, to produce a film. The polymeric preceramic precursor film is converted into a ceramic patternable layer by any suitable process including thermal annealing, electron beam irradiation, ion irradiation, irradiation with ultraviolet and/or visible light, etc. During this process, the polymeric preceramic precursor may crosslink into a rigid, insoluble matrix.

Applied as a hardmask patterning layer, the ceramic patternable layer may be patterned by lithographic techniques (known in the art) and etched by dry etch processes (known in the art) to transfer the lithographic pattern into the ceramic patternable layer to generate a patterned ceramic film. Subsequent, processing steps may include a repetition of these steps along with other commonly used processes known in the art to generate interconnect structures for microelectronic devices. The ceramic patterning layer may be utilized as a clustered hardmask.

Applied as a buried etch stop, the ceramic patternable layer is generated in the same manner as described above. At least one dielectric layer is then applied onto the ceramic patternable layer, where the ceramic patternable layer is a buried etch stop. These dielectric layers are then patterned using conventional lithographic and etch process steps. The buried etch stop, which is chemically different from the dielectric layers placed on top of it serves as a stop layer, where the etch of the dielectric layers can be performed in a controllable fashion and dictates the depth of etch in the structure.

The polymeric preceramic precursor is a polymer molecule that is soluble in an organic solvent, can be applied as a coating by a solvent based process, and contains silicon. The polymeric preceramic precursor can also be a mixture of two or more polymeric components and can have any chain architecture. The polymeric preceramic precursor may be comprised of a polymer where the backbone is primarily comprised of Si—N and/or Si—C bonds. The polymeric preceramic precursor may be selected from systems having silicon including: polysilazanes, polycarbosilanes, polysilasilazane, polysilanes, polysilacarbosilanes, polysiloxazanes, polycarbosilazanes, polysilylcarbodiimides, and polysilacarbosilazanes. The polymeric preceramic precursor may be comprised of a polymer where the backbone is primarily comprised of C—C bonds; an example of which is polysilylcarbodiimides.

The polymeric preceramic precursor is applied by any solvent based process to form a coating. The solvent based process involves the use of a solution of the polymeric preceramic precursor to generate this coating, where various organic solvents suitable for coating can be used. In addition, additives such as adhesion promoters and antistriation agents can be added to this solution to improve adhesion and coating quality, respectively.

The ceramic patterning layer, that is converted from the film comprised of the polymeric preceramic precursor, comprises of a silicon based material and is thermally stable to temperatures of about 300° C. (<1% weight loss/hr). The ceramic patterning layer may be crosslinked and insoluble to organic solvents. Preferably, the ceramic patterning layer may be resistant to processes used to rework (i.e., remove) patterned photoresist layers, including dry etches based on plasmas generated from $O_2$, $N_2$, Ar, He, Ne, $H_2$, or combinations thereof, and wet etches such as acidic and basic solutions.

The ceramic patterning layer, may have a dielectric constant that is less than about 3.3, preferably less than about 2.8, and most preferably about 2.6. The ceramic patterning layer, may also contain porosity that further reduces the dielectric constant. When porosity is introduced to the ceramic patterning layer the dielectric constant can be reduced to less than about 2.6, most preferably to about 1.6. The pores may be generated by the removal of a sacrificial moiety that may be polymeric. The pores may also be generated by a process that involves the elimination of a high boiling point solvent. The pores may have a size scale of about 0.5 nm to about 20 nm and may have a closed cell morphology.

The ceramic patterning layer is processed to produce a patterned ceramic layer by any process known in the art including those that involving optical lithography, imprint lithography, and reactive ion etch. The multilayer substrate in which the ceramic patterning layer is utilized as either a hardmask layer or buried etchstop layer may further include any material layer comprising dielectric, metal, or semiconducting material, as known in the art.

BRIEF DESCRIPTION OF THE DRAWINGS

FIG. 1 is a schematic showing a cross section of a structure having a single patterned ceramic layer of the invention.

FIG. 2 is a schematic showing a cross section of a structure having a clustered patterned ceramic layer of the invention.

FIG. 3 is a schematic showing a cross section of a structure having a patterned buried etch stop.

FIG. 4 is a schematic showing a generalized method to form the inventive patterned ceramic layer.

FIGS. 5(*a*) and 5(*b*), show compositional depth profiles as determined by Auger depth profiling before and after exposure to oxygen plasma.

DESCRIPTION OF THE PREFERRED EMBODIMENTS

The structures, methods, and compositions relating to the inventive patterned ceramic layers of the present invention will now be discussed in greater detail referring to the drawings accompanying the present invention. It is noted that in the accompanying drawings, like and corresponding elements are referred to by like reference numbers.

The patterned ceramic layers may be utilized as either a hardmask or buried etch stop which enable the fabrication of interconnects that may be used in any microelectronic device. The use of the patterned ceramic layer to produce interconnect structures can be performed in any manner known in the art including single damascene and dual damascene processes. For dual damascene processing, either a single or clustered hardmask scheme may be used. The patterned ceramic film may have a thickness of approximately 5 nm–500 nm. Optionally, adhesion promoters may be placed at one or both interfaces of the patterned ceramic film.

Referring to FIG. 1, the first example of the first embodiment includes a structure comprising a single layer of patterned ceramic film on an underlying substrate having one or more films that are intended to be patterned.

The interconnect structure 40, may comprise of multiple levels 1000 where each level includes a via level 1100 and line level 1200. The interconnect structure may include conducting metal features 33 that traverse through the structure and may have interfaces with a lining metal barrier 34 as conventionally known. The conducting metal features and lining metal barrier are surrounded by dielectrics. The dielectrics in the via level include a via level dielectric 32 and an optional cap barrier layer film 36. The dielectrics in the line level 1200 include the line level dielectric 31 and an optional chemical mechanical polishing stop layer 41. Optionally, a dielectric etch stop layer 37 may be placed between the via level dielectric 32 and line level dielectric 31.

Referring to FIG. 2, a second example of the first embodiment includes a structure comprising a bilayer of patterned ceramic film comprised of two different silicon containing dielectrics that are generated from polymeric preceramic precursors, having two distinct patterns on an underlying substrate having one or more films that are intended to be patterned. In this example, the bilayer serves as a clustered hardmask that comprises of a second hardmask layer 63 formed on top of a first hardmask layer 62.

Referring to FIG. 3, a third example of the first embodiment comprises a structure including a single layer of patterned ceramic film 64 that serves as a buried etch stop having, an underlying substrate 1000 having one or more films that are intended to be patterned, and an overlaying film structure 1200 having one or more films that are patterned.

The underlying substrate 1000 is comprised of at least one dielectric or metal layer at an uppermost surface. In the case in which a dielectric is present at the uppermost surface, the dielectric layer may be any dielectric known in the art including: polyarylenes, polyarylene ethers, polysiloxanes, polysilsesquioxanes, or any CVD deposited dielectric having the composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1. The deposited dielectric may alternatively have the composition $Si_vN_wC_xO_yH_z$, where $0.05<v<0.8$, $0<w<0.9$, $0.05<x<0.8$, $0<y<0.8$, $0.05<z<0.8$ for v+w+x+y+z==1. In the case in which a metal layer is formed at the uppermost surface of the substrate, the metal layer may comprise at least one of the following: aluminum, copper, gold, silver, and alloys of these metals. The underlying substrate 1000 may include microelectronic interconnects and devices.

Referring back to FIG. 1, In the case of a single layer hardmask (first example), the hardmask layer 61 may comprise of a pattern that defines the via level dielectric 32 or line level dielectric 31 in a microelectronic interconnect structure. In the case of a clustered hardmask, referring to FIG. 2, the first hardmask layer 62 and second hardmask layer 63 are used to define the via level dielectrics 32 and line level dielectrics 31 in any manner known in the art.

In the case of the third example, referring to FIG. 3, where the ceramic patterning layer serves as a buried etch stop 64, an overlying film structure including a line level dielectric 31 is formed atop the ceramic patterning layer and includes the same pattern. Optionally, one or more hard mask layers and/or a chemical mechanical polishing stop layer 41 may be formed atop the line level dielectric 31. The buried etch stop 64 may be located between the via level dielectric 32 and line level dielectrics 31. The buried etch stop 64 may be a spin-on dielectric. The buried etch stop 64 may be a polysiloxane, polysilsesquioxane, or any CVD deposited dielectric having the composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1. The buried etch stop may also have the composition $Si_vN_wC_xO_yH_z$, where $0.05<v<0.8$, $0<w<0.9$, $0.05<x<0.8$, $0<y<0.8$, $0.05<z<0.8$ for v+w+x+y+z=1. The buried etch stop 64 may also be a ceramic patterning layer. The buried etch stop 64 etches at least five times slower than the line level dielectric 31 for dry etches used to pattern the line level dielectric 31.

For the first embodiment, the via and line dielectric (32 and 31) may be any low-k dielectric known in the art including: polyarylenes, polyarylene ethers, polysiloxanes, polysilsesquioxanes, or any CVD deposited dielectric having the composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1. The via and line dielectric may also have a composition comprising $Si_vN_wC_xO_yH_z$, where $0.05<v<0.8$, $0<w<0.9$, $0.05<x<0.8$, $0<y<0.8$, $0.05<z<0.8$ for v+w+x+y+z=1. The structure may also have an overlaying film structure on top of the interlayer dielectric that serves as a chemical mechanical polishing stop layer 41. The chemical mechanical polishing stop layer may be a spin-on or a CVD deposited dielectric such as polysiloxanes, polysilsesquioxanes, or any CVD deposited dielectric having the composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1. The chemical mechanical polishing stop layer may have the composition $Si_vN_wC_xO_yH_z$, where $0.05<v<0.8$, $0<w<0.9$, $0.05<x<0.8$, $0<y<0.8$, $0.05<z<0.8$ for v+w+x+y+z=1. The optional buried etch stop 37, in the first and second example, may include a dielectric such as: polyarylenes, polyarylene ethers, polysiloxanes, polysilsesquioxanes, or any CVD deposited dielectric having the composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1. The optional buried etch stop 37 may alternatively have the composition $Si_vN_wC_xO_yH_z$, where $0.05<v<0.8$, $0<w<0.9$, $0.05<x<0.8$, $0<y<0.8$, $0.05<z<0.8$ for v+w+x+y+z=1.

Referring to FIG. 4, a method for producing a patterned ceramic layer is described as the second embodiment. In step 1, a polymeric preceramic precursor is dissolved in an organic solvent.

In optional step 2, an adhesion promoter is applied onto the substrate prior to the application of the polymeric preceramic precursor. The adhesion promoter may be used to enhance adhesion between the ceramic patterning layer and adjacent layers.

In step 3, a solvent based approach is used to deposit the polymeric preceramic precursor onto an underlying substrate. Suitable solvent based approaches include: spin coating, spray coating, scan coating, and dip coating. This solvent based approach may be applied to a substrate that is either smooth or is one that contains a patterned topography. In the latter case, the coating that results may fill the gaps and planarize the uppermost surface. If the optional codissolved adhesion promoter is used, the adhesion promoter may segregate to the film interface during coating. The adhesion promoter may comprise of less than about 1% of the solution containing the polymeric preceramic precursor. A sacrificial moiety to produce porosity may also be codissolved in the solution containing the polymeric preceramic precursor. The sacrificial moiety is a sacrificial polymeric material that degrades into low molecular weight byproducts that are expelled from the film during conversion of the polymeric preceramic precursor into the ceramic patterning layer.

In optional step 4, an adhesion promoter may be applied after the application of the polymeric preceramic precursor. The adhesion promoter may be optionally used to enhance adhesion between the ceramic patterning layer and adjacent layers.

In step 5, the polymeric preceramic precursor film is converted into a ceramic patterning layer. The conversion of the polymeric preceramic precursor into the ceramic patterning layer may be through the use of one or a combination of any suitable process including: thermal curing, electron irradiation, ion irradiation, irradiation with ultraviolet and/or visible light. These processes may be performed under inert atmospheres. The inert atmospheres may include nitrogen, argon, helium, hydrogen, and combinations thereof. When converting the polymeric preceramic into a ceramic patterning layer by thermal curing, temperatures in excess of about 300° C. may be used, preferably being greater than about 400° C. Crosslinking mechanisms may occur during the conversion of the polymeric preceramic precursor to the ceramic patterning layer. If the optional codissolved adhesion promoter is used, the adhesion promoter may segregate to film interfaces during this conversion process. When utilizing sacrificial polymeric material, porosity may be generated from an approach that utilizes a high boiling point solvent, where the sacrificial polymeric material degrades and is expelled from the film.

For optional step 6, the adhesion promoter is applied after the conversion of the polymeric preceramic precursor into the ceramic patterning layer. The adhesion promoter may enhance adhesion between the ceramic patterning layer and adjacent layers.

In optional step 7, additional layers of dielectric layers or hardmask layers may be formed following the conversion of the polymeric preceramic precursor into a ceramic patternable layer.

In step 8, the ceramic patterning layer is patterned to create a patterned ceramic layer. The patterned ceramic layer has a thickness of about 5 nm to about 300 nm. This may involve any process known in the art including lithographic processes that involve depositing a photoresist and/or antireflective coating on top of the substrate having a ceramic patterning layer, applying dry etch processes to pattern the ceramic patterning layer to produce a patterned ceramic layer, and cleaning processes used to eliminate undesirable residues and/or byproducts. The dry etch may be performed by exposing the ceramic patterning layer to a reactive plasma which may have a fluorinated organic moiety and may contain at least one of the following: $CH_3F$, $C_2F_6$, He, and $CO_2$.

The photoresist and/or antireflective coating may then be removed during or after exposure to etch processing of the ceramic patterning layer. The etch processing may be by a wet etch process which may involve the use of acids, bases, and/or organic solvents. Alternatively, the removal of photoresist and/or antireflective may be performed using a dry etch that may involve plasmas generated from at least one of the following: $O_2$, $N_2$, Ar, He, Ne, $H_2$, and $CO_2$.

In the case where the patterned ceramic layer is to be utilized at a buried etch stop, at least one dielectric layer may be coated onto the ceramic patternable layer prior to patterning. In such a case, these additional dielectric layer(s) will be patterned in an identical manner to the ceramic patternable layer.

Optionally, cleaning processes at any step may be applied to eliminate any unwanted moieties remaining from other processes. This cleaning may involve exposing the substrate to organic solvents, aqueous acids, aqueous bases, supercritical fluids, exposure to reactive plasmas.

The patterned ceramic layer may be used to define either via level dielectric 32 or line level dielectric 31 in microelectronic interconnects. Subsequent metallization and planarization steps, known in the art, can be employed to produce a microelectronic interconnect structure.

The solution containing the polymeric preceramic precursor can contain an organic solvent. The organic solvent may be one or a combination of the following: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones. The concentration of the polymeric preceramic precursor in solution may be from about 1.0 wt % to about 40.0 wt %.

The polymeric preceramic precursor is a polymeric material that contains silicon and may be comprised of the following: polysilazanes, polycarbosilanes, polysilasilazane, polysilanes, polysilacarbosilanes, polysilylcarbodiimides, polysiloxazanes, polycarbosilazanes, and polysilacarbosilazanes. The polymeric preceramic precursor may contain a partial component of siloxane and/or silsesquioxane. The polymeric preceramic precursor may have pendant functional groups bonded to the chain backbone including, hydrido, vinyl, allyl, alkoxy, silyl, and alkyl groups. The polymeric preceramic precursor may have a molecular weight between 500 and 10000000 g/mole, may be a homopolymer, random copolymer, block copolymer, or a polymer blend, and may have any chain architecture including linear, networked, branched, and dendrimeric. The polymeric preceramic precursor may also have a partial component of siloxane and/or silsesquioxane structure. The polymeric preceramic precursor may have a composition $Si_vN_wC_xO_yH_z$, where $0.1 \leqq v \leqq 0.8$, $0 \leqq w \leqq 0.8$, $0.05 \leqq x \leqq 0.8$, $0 \leqq y \leqq 0.3$, $0.05 \leqq z \leqq 0.8$ for v+w+x+y+z=1. The polymeric preceramic precursor may also have a composition of $Si_vN_wC_xO_yH_z$, where $0.1<v<0.8$, $0<w<0.8$, $0.05<x<0.8$, $0<y<0.3$, $0.05<z<0.8$, and v+w+x+y+z=1. The polymeric preceramic precursor may be a polyureamethylvinylsilazane (KiON), a polycarbomethylsilane, or a polyallylhydridocarbosilane.

After conversion of the polymeric preceramic precursor film into the ceramic patterning layer, the ceramic patterning layer may have a composition of $Si_vN_wC_xO_yH_z$, where $0.1 \leqq v \leqq 0.9$, $0 \leqq w \leqq 0.5$, $0.05 \leqq x \leqq 0.9$, $0 \leqq y \leqq 0.5$, $0.05 \leqq z \leqq 0.8$ for v+w+x+y+z=1. Alternatively, the ceramic patterning layer may have the composition $Si_vN_wC_xO_yH_z$, where $0.1<v<0.9$, $0<w<0.5$, $0.05<x<0.9$, $0<y<0.5$, $0.05<z<0.8$ for v+w+x+y+z=1. An example of a preferred composition is v=0.18+/−0.03, w=0.16+/−0.03, x=0.17+/−0.03, y=0.01+/−0.03, and z=0.48+/−0.03.

Optionally, additives that improve adhesion quality or coating quality such as adhesion promoters and antistriation agents may be codissolved in solution. The concentration of additives in solutions may be less than about 1.0 wt %. The adhesion promoter is selected from the group consisting of $Si_xL_yR_z$, where L is selected from the group consisting of hydroxy, methoxy, ethoxy, acetoxy, alkoxy, carboxy, amines, halogens, and R is selected from the group consisting of hydrido, methyl, ethyl, vinyl, and phenyl (any alkyl or aryl). The adhesion promoter may be: hexamethyldisilazane, vinyltriacetoxysilane, aminopropyltrimethoxysilane, and vinyl trimethoxysilane. The antistriation agent may be less than about 0.1% of the solution containing the polymeric preceramic precursor. The antistriation agent may be utilized to produce films of high uniformity.

The solution containing the polymeric preceramic precursor, may also contain moieties that produce porosity in the system, including sacrificial polymeric materials that degrade into low molecular weight byproducts and/or high boiling point solvents that are expelled from the film during the conversion of the polymeric preceramic precursor into the ceramic patterning layer. The sacrificial polymeric material may be one of, a combination of, or a copolymer of: poly(stryenes), poly(esters), poly(methacrylates), poly (acrylates), poly(glycols), poly(amides), and poly (norbornenes).

Referring to FIGS. 5(*a*) and 5(*b*), compositional depth profiles as determined by Auger depth profiling before and after exposure to oxygen plasma is shown. The relative concentrations of signals corresponding to the various elements are shown as a function of sputter time. The film depth can be calculated using the etch rate which was about 10 nm/minute. The data indicates that the ceramic patternable layer generated from a polysilazane polymeric preceramic precursor is resistant to the oxygen plasma exposure (which simulates removal of a photoresist) and has only a slight modification in its composition at the uppermost surface. From these results, it is determined that the ceramic patternable layer can withstand typical photoresist rework steps that remove photoresist and/or antireflective coating layers.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A multilayer interconnect structure for semiconducting devices comprising: at least one layer of patterned ceramic film having at least one composition $Si_vN_wC_xO_yH_z$, where $0.1 \leqq v \leqq 0.9$, $0 \leqq w \leqq 0.5$, $0.05 \leqq x \leqq 0.9$, $0 \leqq y \leqq 0.5$, $0.05 \leqq z \leqq 0.8$ for v+w+x+y+z=1, atop a substrate having one or more layers, where said one or more layers includes at least one metal layer.

2. The multilayer interconnect structure of claim 1, wherein said patterned ceramic film comprises at least two different silicon containing dielectrics having two distinct patterns, forming a clustered hardmask layer including a second hardmask layer atop a first hardmask layer.

3. The multilayer interconnect structure of claim 2, wherein said first hardmask layer defines a via level dielectric and said second hardmask layer defines a line level dielectric.

4. The multilayer interconnect structure of claim 1, wherein said substrate includes microelectronic interconnects and microelectronic devices.

5. The multilayer interconnect structure of claim 1, wherein said at least one patterned ceramic layer has a thickness from about 5 nm to about 300 nm.

6. The multilayer interconnect structure of claim 1, wherein the said at least one patterned ceramic layer contains porosity.

7. A multilayer interconnect structure comprising:

a multilayer substrate having at least a first dielectric layer and a second dielectric layer; where at least one ceramic buried etch stop having a composition $Si_vN_wC_xO_yH_z$, where $0.05 \leqq v \leqq 0.8$, $0 \leqq w \leqq 0.9$, $0.05 \leqq x \leqq 0.8$, $0 \leqq y \leqq 0.8$, $0.05 \leqq z \leqq 0.8$ for v+w+x+y+z=1, is between said first dielectric layer and said second dielectric layer.

8. The multilayer interconnect structure of claim 7, wherein the said first dielectric layer is a line level dielectric and said second dielectric layer is a via level dielectric.

9. The multilayer interconnect structure of claim 7 further comprising at least one patterned ceramic hardmask having composition $Si_vN_wC_xO_yH_z$, where $0.1 \leqq v \leqq 0.9$, $0 \leqq w \leqq 0.5$, $0.05 \leqq x \leqq 0.9$, $0 \leqq y \leqq 0.5$, $0.05 \leqq z \leqq 0.8$ for v+w+x+y+z=1, atop said substrate.

* * * * *